United States Patent
Kaida et al.

(10) Patent No.: US 9,627,603 B2
(45) Date of Patent: Apr. 18, 2017

(54) QUARTZ VIBRATOR HAVING A DOME-SHAPED CAP

(71) Applicant: MURATA MANUFACTURING CO., LTD., Nagaokakyo-shi, Kyoto-Fu (JP)

(72) Inventors: Hiroaki Kaida, Nagaokakyo (JP); Manabu Ibayashi, Nagaokakyo (JP); Yoshifumi Saito, Nagaokakyo (JP); Yuichiro Nagamine, Nagaokakyo (JP); Katsuma Moroishi, Nagaokakyo (JP); Takuya Kono, Nagaokakyo (JP); Kazuhiro Mimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 263 days.

(21) Appl. No.: 14/532,584

(22) Filed: Nov. 4, 2014

(65) Prior Publication Data
US 2015/0054385 A1 Feb. 26, 2015

Related U.S. Application Data

(63) Continuation of application No. PCT/JP2013/063755, filed on May 17, 2013.

(30) Foreign Application Priority Data

May 18, 2012 (JP) ................................ 2012-113937

(51) Int. Cl.
H01L 41/08 (2006.01)
H01L 41/053 (2006.01)
H03H 9/10 (2006.01)

(52) U.S. Cl.
CPC ......... *H01L 41/0533* (2013.01); *H03H 9/105* (2013.01); *H03H 9/1021* (2013.01)

(58) Field of Classification Search
CPC ...... H03H 9/1014; H03H 9/1021; H03H 9/10; H03H 9/1071; H03H 9/1035; H03H 9/105; H03H 9/1085
(Continued)

(56) References Cited

U.S. PATENT DOCUMENTS 6,262,513 B1 * 7/2001 Furukawa ............... H01L 21/56
257/E21.502
2003/0020373 A1 * 1/2003 Irikura ................ H01M 8/0221
310/348

(Continued)

FOREIGN PATENT DOCUMENTS

JP 60-194544 3/1985
JP 2000-200847 A 7/2000

(Continued)

OTHER PUBLICATIONS

PCT/JP2013/063755 Written Opinion dated Jul. 17, 2013.
PCT/JP2013/063755 ISR dated Jul. 17, 2013.

*Primary Examiner* — J. San Martin
(74) *Attorney, Agent, or Firm* — Arent Fox LLP

(57) ABSTRACT

A quartz vibrator that includes a substrate, a quartz vibrating element, and a dome-shaped cap. The quartz vibrating element is mounted on the substrate. The cap is bonded to the substrate. The cap defines and forms a sealed space that seals the quartz vibrating element along with the substrate. The cap has a side wall portion, a ceiling portion, and a connecting portion. The side wall portion encloses the quartz vibrating element. The ceiling portion is positioned above the quartz vibrating element. The connecting portion connects the side wall portion and the ceiling portion. The connecting portion is thinner than the side wall portion and the ceiling portion.

20 Claims, 3 Drawing Sheets

(58) Field of Classification Search
USPC .................................................. 310/344, 348
See application file for complete search history.

(56) References Cited

U.S. PATENT DOCUMENTS

| | | | |
|---|---|---|---|
| 2005/0023661 A1 | 2/2005 | Matsubara et al. | |
| 2008/0272858 A1* | 11/2008 | Furihata | H03H 9/02984 333/193 |
| 2012/0174360 A1* | 7/2012 | Sato | H03H 9/1021 29/25.35 |
| 2014/0009875 A1* | 1/2014 | Nakagawa | H05K 7/06 361/679.01 |
| 2015/0001997 A1* | 1/2015 | Saito | H03H 3/02 310/344 |
| 2015/0155849 A1* | 6/2015 | Kikuchi | H03H 9/172 310/348 |
| 2015/0357254 A1* | 12/2015 | Mikami | H01L 23/49822 257/704 |

FOREIGN PATENT DOCUMENTS

| | | |
|---|---|---|
| JP | 2000-307016 A | 11/2000 |
| JP | 2004-179555 A | 6/2004 |
| JP | 2006-041296 A | 2/2006 |
| JP | 2006-295246 A | 10/2006 |
| JP | 2007-043340 A | 2/2007 |
| JP | 2010-021563 A | 1/2010 |
| JP | 2010-245933 A | 10/2010 |
| JP | 2010-262966 A | 11/2010 |
| JP | 2011-139223 A | 7/2011 |

* cited by examiner

QUARTZ VIBRATOR HAVING A DOME-SHAPED CAP

CROSS REFERENCE TO RELATED APPLICATIONS

The present application is a continuation of International application No. PCT/JP2013/063755, filed May 17, 2013, which claims priority to Japanese Patent Application No. 2012-113937, filed May 18, 2012, the entire contents of each of which are incorporated herein by reference.

FIELD OF THE INVENTION

The present invention relates to quartz vibrators.

BACKGROUND OF THE INVENTION

Piezoelectric vibrating devices such as quartz vibrators have thus far been used as oscillators and the like. As an example of such a piezoelectric vibrating device, Patent Document 1 discloses a piezoelectric vibrating device that includes a substrate on which a piezoelectric vibrator is mounted and a metal cap that is bonded to the substrate and that seals the piezoelectric vibrator along with the substrate. In Patent Document 1, the metal cap and the substrate are connected by a sealing resin.

Patent Document 1: Japanese Unexamined Patent Application Publication No. 2010-245933

SUMMARY OF THE INVENTION

The frequency characteristics of a quartz vibrating element change greatly due to external disturbances such as stress, for example. Accordingly, with a quartz vibrator that employs a quartz vibrating element, is extremely important to increase the frequency precision by making it difficult for external disturbances to act on the quartz vibrating element.

However, according to the piezoelectric vibrating device disclosed in Patent Document 1, the sealing resin is water-absorbent, meaning that the humidity in the sealed space can change with ease; there is thus a problem in that the frequency precision of the quartz vibrator can drop.

It is a primary object of the present invention to provide a quartz vibrator having high frequency precision.

A quartz vibrator according to the present invention includes a substrate, a quartz vibrating element, and a dome-shaped cap. The quartz vibrating element is mounted on the substrate. The cap is bonded to the substrate. The cap defines and forms a sealed space that seals the quartz vibrating element along with the substrate. The cap includes a side wall portion, a ceiling portion, and a connecting portion. The side wall portion encloses the quartz vibrating element. The ceiling portion is positioned above the quartz vibrating element. The connecting portion connects the side wall portion and the ceiling portion. The connecting portion is thinner than the side wall portion and the ceiling portion. In the present invention, the cap and the substrate are bonded by an inorganic bonding material.

According to a specific aspect of the quartz vibrator according to the present invention, the thickness of the connecting portion is not greater than 0.85 times the respective thicknesses of the side wall portion and the ceiling portion.

According to another specific aspect of the quartz vibrator according to the present invention, the thickness of the connecting portion is not less than 0.5 times the respective thicknesses of the side wall portion and the ceiling portion.

According to another specific aspect of the quartz vibrator according to the present invention, the side wall portion is vertical relative to a main surface of the substrate. The ceiling portion is parallel to the main surface of the substrate.

According to yet another specific aspect of the quartz vibrator according to the present invention, the cap is made of a metal.

According to another specific aspect of the quartz vibrator according to the present invention, the inorganic bonding material is bonded to the cap at an end surface and both side surfaces of a bonding area of the cap where the cap is bonded to the substrate.

According to yet another specific aspect of the quartz vibrator according to the present invention, the inorganic bonding material has a fillet shape.

According to yet another specific aspect of the quartz vibrator according to the present invention, a length, in the height direction of the cap, of an area where the inorganic bonding material and a side surface of the bonding area of the cap are bonded to each other is greater than a width of the end surface of the bonding area of the cap.

According to another specific aspect of the quartz vibrator according to the present invention, the substrate includes a conductor formed in a frame shape on one main surface of the substrate, and the cap is mounted on the conductor.

According to another specific aspect of the quartz vibrator according to the present invention, the conductor is configured of a base layer and a plating layer formed on the base layer, and the base layer is covered by the plating layer so that the base layer is not exposed to the exterior.

According to yet another specific aspect of the quartz vibrator according to the present invention, a width of the conductor is greater than the width of the end surface of the bonding area of the cap.

According to yet another specific aspect of the quartz vibrator according to the present invention, the conductor contains Au on an outer surface thereof, the cap contains Au on an outer surface thereof, and the inorganic bonding material contains Au.

According to yet another specific aspect of the quartz vibrator according to the present invention, the conductor has a Au plating layer in an outermost layer of the conductor, the cap has a Au plating layer in an outermost layer of the cap, and the inorganic bonding material is a Au/Sn alloy.

According to the present invention, a quartz vibrator having high frequency precision can be provided.

DETAILED DESCRIPTION OF THE PREFERRED EMBODIMENTS

Figure 1:
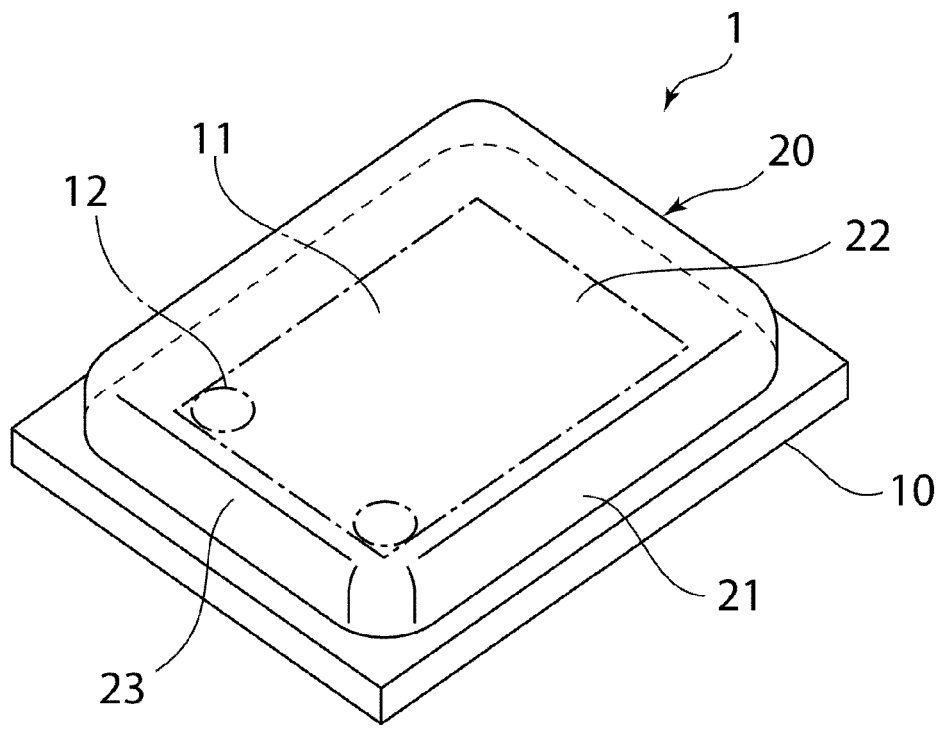
FIG. 1 is a schematic perspective view illustrating a quartz vibrator according to an embodiment of the present invention.

Examples of preferred embodiments for carrying out the present invention will be described hereinafter. Note, however, that the following embodiments are merely examples. The present invention is not intended to be limited to the following embodiments in any way.

Furthermore, in the drawings referred to in the embodiments and the like, members having functions that are substantially identical are given identical reference numerals. The drawings referred to in the embodiments and the like are schematic depictions, and as such the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood from the following descriptions.

Figure 2:
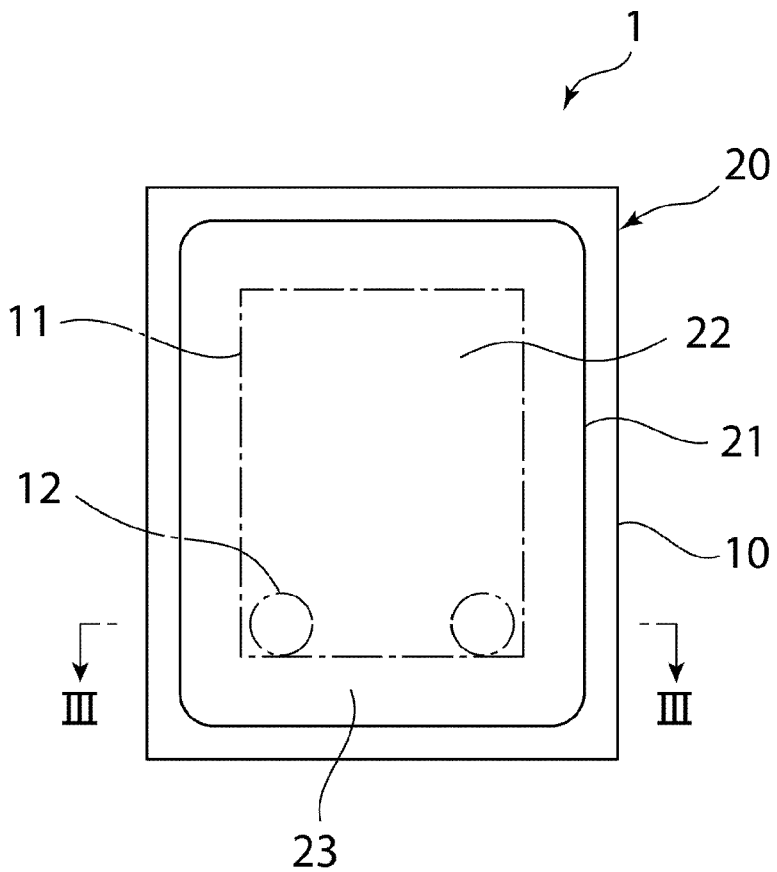
FIG. 2 is a schematic plan view illustrating a quartz vibrator according to an embodiment of the present invention.
Figure 3:
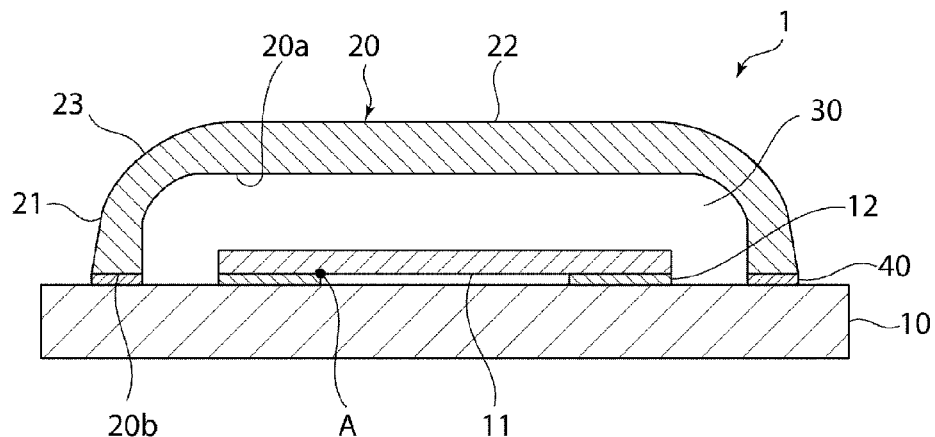
FIG. 3 is a schematic cross-sectional view taken along a III-III line shown in FIG. 2.

FIG. 1 is a schematic perspective view illustrating a quartz vibrator 1 according to the present embodiment. FIG. 2 is a schematic plan view illustrating the quartz vibrator 1 according to the present embodiment. FIG. 3 is a schematic cross-sectional view illustrating the quartz vibrator 1 according to the present embodiment.

As shown in FIGS. 1 to 3, the quartz vibrator 1 includes a substrate 10. The substrate 10 can be configured of a ceramic material such as alumina, for example.

A quartz vibrating element 11 is mounted on the substrate 10. The quartz vibrating element 11 has an approximately rectangular plate shape. The quartz vibrating element 11 is supported on the substrate 10 in a cantilever state by support members 12 provided on one side thereof in a lengthwise direction. The support members 12 are provided at both corner areas of the quartz vibrating element 11 in the widthwise direction thereof, at one side end portion of the quartz vibrating element 11 in the lengthwise direction thereof. The support members 12 can be configured of a conductive adhesive that has set, or the like, for example.

A cap 20 is disposed on the substrate 10. The cap 20 has a dome shape. The cap 20 has a recessed portion 20a. The cap 20 is disposed so that the open side of the recessed portion 20a faces the substrate 10. A sealed space 30 in which the quartz vibrating element 11 is disposed is defined and formed by the cap 20 and the substrate 10. The cap 20 is bonded to the substrate 10 at an end surface 20b thereof. The cap 20 and the substrate 10 are bonded to each other using an inorganic bonding material 40 such as metal, glass, or the like. Accordingly, moisture, gases, and the like can be suppressed from entering into the sealed space 30. A Au/Sn alloy can be given as an example of a preferred material to be used as the inorganic bonding material 40.

The cap 20 and the substrate 10 are bonded to each other via the inorganic bonding material 40 in a largely depressurized state. Accordingly, the sealed space 30 is in a depressurized state, or in other words, is in a so-called vacuum state. Because the sealed space 30 is in the so-called vacuum state, it is difficult for vibrations of the quartz vibrating element 11 to be inhibited. Accordingly, the frequency precision can be effectively increased.

If the sealed space 30 is depressurized, it becomes easier for the aforementioned moisture, gases, and so on to enter. However, the cap 20 and the substrate 10 are bonded to each other by the inorganic bonding material 40, and thus the entrance of moisture, gases, and so on can be effectively suppressed as described above.

It is preferable for the cap 20 to be configured of an elastic material. It is preferable for the cap 20 to be made of a metal, for example. Specifically, the cap 20 can be configured of nickel, a nickel alloy such as iron/nickel alloy, Kovar, stainless steel, or the like, for example.

The cap 20 has a side wall portion 21, a ceiling portion 22, and a connecting portion 23. The side wall portion 21 is provided in a frame shape so as to enclose the quartz vibrating element 11 when viewed from above. The side wall portion 21 extends from a main surface of the substrate 10, in a direction vertical relative to the main surface of the substrate 10. The ceiling portion 22 is positioned above the quartz vibrating element 11. The ceiling portion 22 is parallel to the main surface of the substrate 10. The side wall portion 21 and the ceiling portion 22 are connected by the connecting portion 23. The connecting portion 23 has a curved structure. The connecting portion 23 configures ridge areas and corner areas of the cap 20.

Caps and substrates generally have different thermal expansion coefficients. Accordingly, when the temperature of the quartz vibrator changes, stress arises in both the cap and the substrate due to the difference in the thermal expansion coefficients between the cap and the substrate. Stress remaining in the substrate is exerted on the quartz vibrating element mounted on the substrate, and furthermore, the magnitude of the stress exerted on the quartz vibrating element varies when the stress remaining in the substrate varies. There are thus cases where the frequency precision of the quartz vibrator drops.

Figure 4:
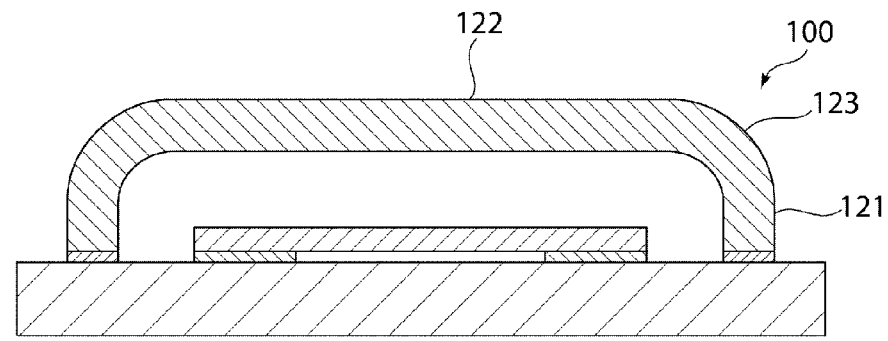
FIG. 4 is a schematic cross-sectional view illustrating a quartz vibrator according to a reference example.

Here, according to the quartz vibrator 1, the connecting portion 23 is thinner than the side wall portion 21 and the ceiling portion 22. It is thus easier for the cap 20 to deform when stress is exerted on the cap 20, as compared to, for example, a quartz vibrator 100 according to a reference example shown in FIG. 4, in which a connecting portion 123 has the same thickness as a side wall portion 121 and a ceiling portion 122. Accordingly, the remaining stress exerted on the cap 20 is reduced, and the stress remaining in the substrate 10 is also reduced. This in turn reduces the stress exerted on the quartz vibrating element 11 from the substrate 10. As a result, a high frequency precision can be realized.

Figure 5:
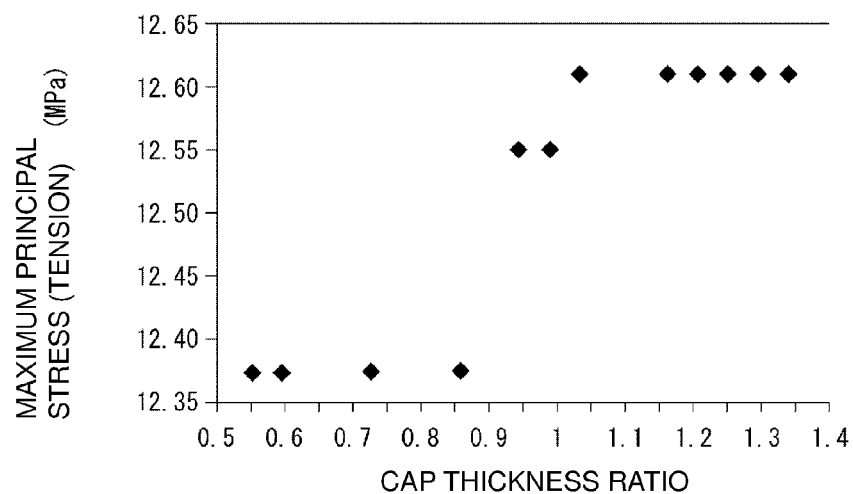
FIG. 5 is a graph illustrating a relationship between a thickness ratio and a maximum principal stress.

FIG. 5 is a graph illustrating a relationship between a thickness ratio and a maximum principal stress. To be more specific, in FIG. 5, the thickness ratio on the horizontal axis is a ratio of the thickness of the connecting portion 23 relative to the thickness of the ceiling portion 22 ((connecting portion 23 thickness)/(ceiling portion 22 thickness)). When measuring the thickness of the ceiling portion 22, the thickness of a central area of the ceiling portion 22 was measured, whereas when measuring the thickness of the connecting portion 23, the thickness of the thinnest part of the connecting portion 23 was measured. Note that in the present embodiment, the side wall portion 21 and the ceiling portion 22 have the same thickness, and thus the thickness ratio that is the ratio of the thickness of the connecting portion 23 relative to the side wall portion 21 takes on the same values as those shown in FIG. 5. The maximum principal stress on the vertical axis is a maximum value of tension stress exerted on a point A indicated in FIG. 3 when the quartz vibrator 1 is cooled from a temperature of 300° C. to −40° C.

Note that the data indicated in FIG. 5 is data obtained under the following conditions.

Substrate 10: alumina ceramic substrate (thermal expansion coefficient: $5.4 \times 10^{-6}/°$ C.; Young's modulus: $220 \times 10^9$ Pa)

Cap 20: 42Ni alloy (thermal expansion coefficient: $5.0 \times 10^{-6}/°$ C.; Young's modulus: $200 \times 10^9$ Pa)

Support members 12: silicone-based conductive adhesive that has set (thermal expansion coefficient: $100 \times 10^{-6}/°$ C.; Young's modulus: $0.1 \times 10^9$ Pa)

The numerical values of the points plotted in FIG. 5 are shown in Table 1.

TABLE 1

| CAP THICKNESS RATIO | MAXIMUM PRINCIPAL STRESS (TENSION) (MPa) |
|---|---|
| 0.55 | 12.37 |
| 0.59 | 12.37 |
| 0.73 | 12.37 |
| 0.86 | 12.38 |
| 0.94 | 12.55 |
| 0.99 | 12.55 |
| 1.03 | 12.61 |
| 1.16 | 12.61 |
| 1.20 | 12.61 |
| 1.25 | 12.61 |
| 1.29 | 12.61 |
| 1.34 | 12.61 |

From the results shown in FIG. 5, it can be seen that the maximum principal stress can be reduced by setting the thickness of the connecting portion 23 to not more than 0.85 times the thickness of the side wall portion 21 and the thickness of the ceiling portion 22. Accordingly, it can be seen that the frequency precision can be further improved by setting the thickness of the connecting portion 23 to not more than 0.85 times the thickness of the side wall portion 21 and the thickness of the ceiling portion 22. However, if the connecting portion 23 is too thin, the rigidity of the connecting portion 23 may decrease too much. Accordingly, it is preferable for the thickness of the connecting portion 23 to not less than 0.5 times the thickness of the side wall portion 21 and the thickness of the ceiling portion 22.

Meanwhile, because the bonding material 40 that bonds the cap 20 and the substrate 10 to each other is an inorganic bonding material, the bonding material is less water-absorbent than a sealing resin, which makes it possible to improve the seal of the sealed space. From the standpoint of providing a better seal, it is desirable to employ, of the inorganic bonding materials mentioned above, a metal, which is more dense. Furthermore, because an inorganic bonding material fixes more strongly to the cap 20 and the substrate 10 than a sealing resin, which provides an increased bonding strength between the cap 20 and the substrate 10. Meanwhile, the inorganic bonding material itself is harder than a sealing resin and bonds the cap 20 and the substrate 10 strongly to each other, making it easy for stress to arise between the cap 20 and the substrate 10, which increases the stress remaining in the substrate 10 and by extension the stress exerted on the quartz vibrating element 11. It is precisely for this reason that the connecting portion 23 is made thinner than the side wall portion 21 and the ceiling portion 22 and the remaining stress is dissipated.

Note that the thickness ratio between the side wall portion 21 and the ceiling portion 22 is not particularly limited. For example, the side wall portion 21 and the ceiling portion 22 may be set to the same thickness. The side wall portion 21 may be set thicker than the ceiling portion 22, or thinner than the ceiling portion 22.

Figure 6:
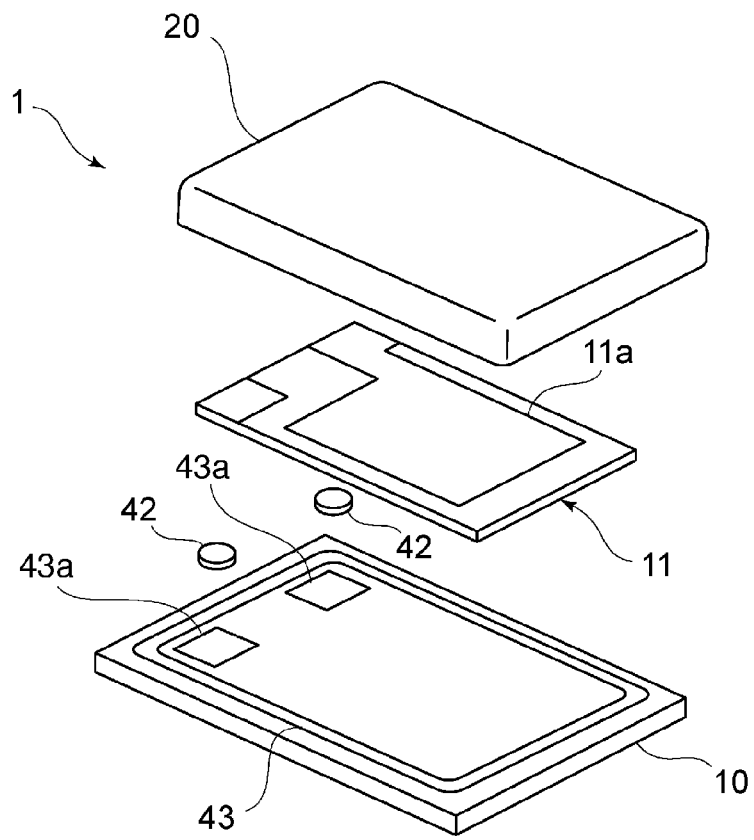
FIG. 6 is an exploded perspective view illustrating a quartz vibrator according to another embodiment of the present invention.
Figure 7:
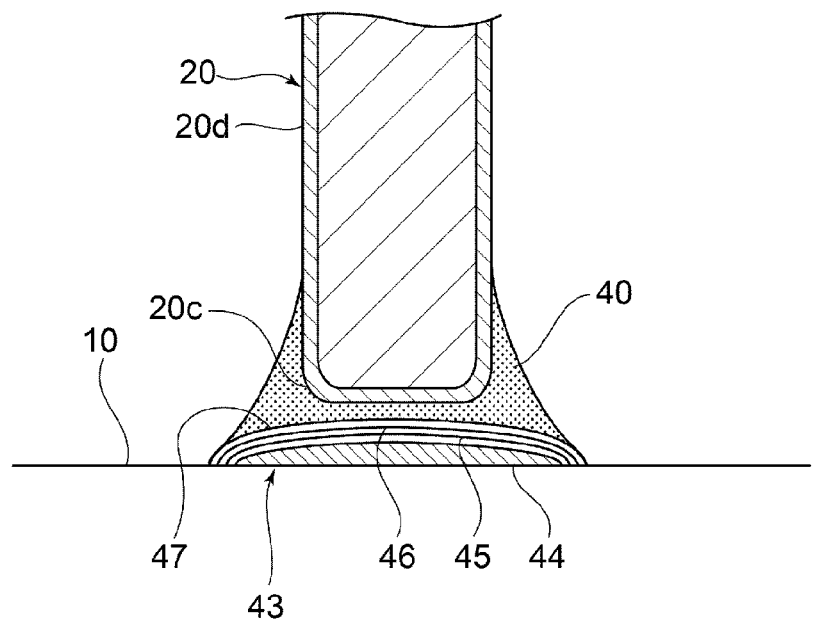
FIG. 7 is a partially cut-out cross-sectional view illustrating an area where a cap and a substrate are bonded in the quartz vibrator illustrated in FIG. 6.

FIGS. 6 and 7 are diagrams illustrating the configuration of a quartz vibrator according to another embodiment of the present invention in more detail, where FIG. 6 is an exploded perspective view illustrating an overview of the quartz vibrator 1 and FIG. 7 is a partially cut-out cross-sectional view illustrating an area where the substrate 10 and the cap 20 are bonded in the quartz vibrator.

As shown in FIG. 6, in the quartz vibrating element 11, electrodes 11a are formed on the front and rear surfaces of a quartz chip (the electrode on the rear surface is not shown). The electrodes 11a oppose each other in the thickness direction of the quartz chip. The electrodes formed on the quartz vibrating element 11 are electrically connected to conductors 43a and 43a formed on one main surface of the substrate 10 via conductive adhesives 42 and 42. The conductor 43a is electrically connected to an outer electrode formed on another main surface of the substrate 10 via a via conductor (not shown) formed in the substrate 10.

The conductor 43 has a contour that conforms to a bonding area 20c of the cap 20 on the one main surface of the substrate 10. Specifically, the conductor 43 is formed having a frame shape.

As shown in FIG. 7, the conductor 43 has a long, semi-oval shape when viewed as a cross-section. Here, the conductor 43 is formed of a base layer 44 containing Mo, a Ni plating layer 45, a Pd plating layer 46, and a Au plating layer 47, in that order from the bottom. The base layer is covered by the plating layers formed thereabove, and as such is not exposed to the exterior. Note that the conductor 43a and the outer electrode can be configured having the same layer structure as the conductor 43.

As shown in FIG. 7, the bonding area 20c of the cap 20 has a shape in which a tip thereof extends in a rounded shape. This shape provides an effect of smoothing the wet-rising of the inorganic bonding material 40, which will be mentioned later. The cap 20 has a metallic layer 20d on a surface thereof, and the metallic layer 20d is configured of a plating layer configured of Au or a Au alloy.

As shown in FIGS. 6 and 7, the substrate 10 and the cap 20 are bonded to each other via the inorganic bonding material 40. The bonding material is configured of a Au/Sn alloy. As described earlier, the inorganic bonding material 40 is temporarily melted when bonding the cap 20, and is then set. The metallic layer 20d of the cap 20, the outermost plating layer of the conductor 43, and the inorganic bonding material 40, each contain Au, and thus are easily wetted to each other. The inorganic bonding material 40 thus takes on a fillet shape after setting. The inorganic bonding material 40 wet-rises up to the side surfaces of the cap 20, in addition to the end surface thereof. Furthermore, the inorganic bonding material 40 spreads out to cover the plating layer of the conductor 43.

Accordingly, the base layer 44 of the conductor 43, which is relatively porous, is covered by a plating layer. As such, the base layer 44 is not exposed to the exterior, which makes it difficult for moisture to enter via the base layer. The inorganic bonding material 40 is itself configured of a metal, and thus is denser and less water-absorbent than an adhesive containing a resin. A border between the inorganic bonding material 40 and the cap 20 and a border between the inorganic bonding material 40 and the conductor 43 are widely sealed as a result of the inorganic bonding material 40 spreading out. A path through which moisture enters is lengthened as a result, which makes it difficult for moisture to enter.

Accordingly, the sealed space formed by the substrate 10, the conductor 43, the inorganic bonding material 40, and the cap 20 is sealed with more certainty. The frequency precision of the quartz vibrator 1 stabilizes as a result.

REFERENCE SIGNS LIST 1 quartz vibrator
10 substrate
11 quartz vibrating element
12 support member
20 cap
20a recessed portion
20b end surface
21 side wall portion
22 ceiling portion
23 connecting portion
30 sealed space
40 inorganic bonding material

The invention claimed is:

1. A quartz vibrator comprising:
   a substrate;
   a quartz vibrating element on the substrate;
   a dome-shaped cap bonded to the substrate and that defines and forms a sealed space that seals the quartz vibrating element along with the substrate; and
   an inorganic bonding material that bonds the substrate to the cap,
   the cap including a side wall portion that encloses the quartz vibrating element, a ceiling portion that is positioned above the quartz vibrating element, and a connecting portion that connects the side wall portion and the ceiling portion, the connecting portion being thinner than the side wall portion and the ceiling portion.

2. The quartz vibrator according to claim 1, wherein a thickness of the connecting portion is not greater than 0.85 times respective thicknesses of the side wall portion and the ceiling portion.

3. The quartz vibrator according to claim 1, wherein the thickness of the connecting portion is not less than 0.5 times the respective thicknesses of the side wall portion and the ceiling portion.

4. The quartz vibrator according to claim 1, wherein the side wall portion is arranged vertical relative to a main surface of the substrate, and the ceiling portion is arranged parallel to the main surface of the substrate.

5. The quartz vibrator according to claim 1, wherein the inorganic bonding material is bonded to the cap along an end surface and opposed side surfaces of a bonding area of the cap.

6. The quartz vibrator according to claim 5, wherein the inorganic bonding material has a fillet shape.

7. The quartz vibrator according to claim 5, wherein a length, in a height direction of the cap, of an area where the inorganic bonding material and one of the side surfaces of the bonding area of the cap are bonded to each other is greater than a width of the end surface of the bonding area of the cap.

8. A quartz vibrator comprising:
   a substrate;
   a quartz vibrating element on the substrate; and
   a dome-shaped cap bonded to the substrate and that defines and forms a sealed space that seals the quartz vibrating element along with the substrate,
   wherein the cap is metal and includes a side wall portion that encloses the quartz vibrating element, a ceiling portion that is positioned above the quartz vibrating element, and a connecting portion that connects the side wall portion and the ceiling portion, the connecting portion being thinner than the side wall portion and the ceiling portion.

9. The quartz vibrator according to claim 8, wherein a thickness of the connecting portion is not greater than 0.85 times respective thicknesses of the side wall portion and the ceiling portion.

10. The quartz vibrator according to claim 8, wherein a thickness of the connecting portion is not less than 0.5 times respective thicknesses of the side wall portion and the ceiling portion.

11. The quartz vibrator according to claim 8, wherein the side wall portion is arranged vertical relative to a main surface of the substrate, and the ceiling portion is arranged parallel to the main surface of the substrate.

12. A quartz vibrator comprising:
    a substrate;
    a quartz vibrating element on the substrate; and
    a dome-shaped cap bonded to the substrate and that defines and forms a sealed space that seals the quartz vibrating element along with the substrate,
    the cap including a side wall portion that encloses the quartz vibrating element, a ceiling portion that is positioned above the quartz vibrating element, and a connecting portion that connects the side wall portion and the ceiling portion, the connecting portion being thinner than the side wall portion and the ceiling portion, and
    wherein the substrate includes a frame-shaped conductor on one main surface of the substrate, and the cap is mounted on the conductor.

13. The quartz vibrator according to claim 12, wherein the conductor includes a base layer and a plating layer on the base layer.

14. The quartz vibrator according to claim 13, wherein the base layer is covered by the plating layer so that the base layer is not exposed to the exterior.

15. The quartz vibrator according to claim 12, wherein a width of the conductor is greater than a width of an end surface of a bonding area of the cap.

16. The quartz vibrator according to claim 12,
    wherein the conductor contains Au on an outer surface thereof;
    the cap contains Au on an outer surface thereof; and
    the inorganic bonding material contains Au.

17. The quartz vibrator according to claim 16,
    wherein the conductor has a Au plating layer in an outermost layer of the conductor;
    the cap has a Au plating layer in an outermost layer of the cap; and
    the inorganic bonding material is a Au/Sn alloy.

18. The quartz vibrator according to claim 12, wherein a thickness of the connecting portion is not greater than 0.85 times respective thicknesses of the side wall portion and the ceiling portion.

19. The quartz vibrator according to claim 12, wherein a thickness of the connecting portion is not less than 0.5 times respective thicknesses of the side wall portion and the ceiling portion.

20. The quartz vibrator according to claim 12, wherein the side wall portion is arranged vertical relative to a main surface of the substrate, and the ceiling portion is arranged parallel to the main surface of the substrate.

* * * * *